United States Patent
Hasebe et al.

(10) Patent No.: US 7,462,571 B2
(45) Date of Patent: *Dec. 9, 2008

(54) FILM FORMATION METHOD AND APPARATUS FOR SEMICONDUCTOR PROCESS FOR FORMING A SILICON NITRIDE FILM

(75) Inventors: Kazuhide Hasebe, Minami-Alps (JP); Mitsuhiro Okada, Kai (JP); Pao-Hwa Chou, Kai (JP); Chaeho Kim, Kofu (JP); Jun Ogawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 311 days.

This patent is subject to a terminal disclaimer.

(21) Appl. No.: 11/188,736

(22) Filed: Jul. 26, 2005

(65) Prior Publication Data

US 2006/0032443 A1    Feb. 16, 2006

(30) Foreign Application Priority Data

| Jul. 28, 2004 | (JP) | ............................ 2004-220555 |
| Feb. 23, 2005 | (JP) | ............................ 2005-048060 |
| Jun. 17, 2005 | (JP) | ............................ 2005-177344 |

(51) Int. Cl.
H01L 21/31 (2006.01)

(52) U.S. Cl. ..................... 438/791; 438/792; 438/775

(58) Field of Classification Search ................ 438/758, 438/762–765, 769–770, 775, 791, 792
See application file for complete search history.

(56) References Cited

U.S. PATENT DOCUMENTS

| 6,815,350 B2 | 11/2004 | Kim et al. |
| 2003/0232514 A1* | 12/2003 | Kim et al. .................... 438/791 |
| 2006/0014399 A1* | 1/2006 | Joe ............................. 438/791 |

FOREIGN PATENT DOCUMENTS

| EP | 0394054 A2 * | 10/1990 |
| JP | 6-34974 | 2/1994 |
| JP | 8-31454 | 3/1996 |
| JP | 2000-100812 | 4/2000 |
| JP | 2004-6801 | 1/2004 |
| KR | 2003-0072104 | 9/2003 |

* cited by examiner

*Primary Examiner*—Thanh Nguyen
(74) *Attorney, Agent, or Firm*—Oblon, Spivak, McClelland, Maier & Neustadt, P.C.

(57) ABSTRACT

An impurity-doped silicon nitride or oxynitride film is formed on a target substrate by CVD, in a process field to be selectively supplied with a first process gas containing a silane family gas, a second process gas containing a nitriding or oxynitriding gas, and a third process gas containing a doping gas. This method alternately includes first to fourth steps. The first step performs supply of the first and third process gases to the field. The second step stops supply of the first to third process gases to the field. The third step performs supply of the second process gas to the field while stopping supply of the first and third process gases to the field, and includes an excitation period of exciting the second process gas by an exciting mechanism. The fourth step stops supply of the first to third process gases to the field.

15 Claims, 9 Drawing Sheets

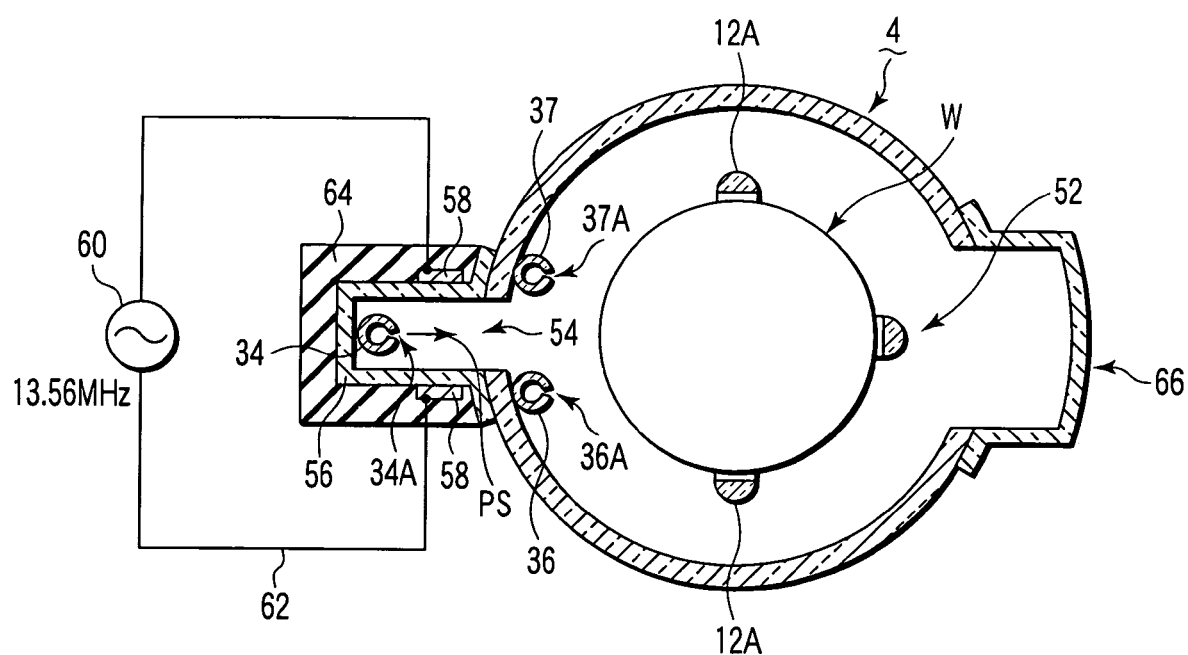
F I G. 2

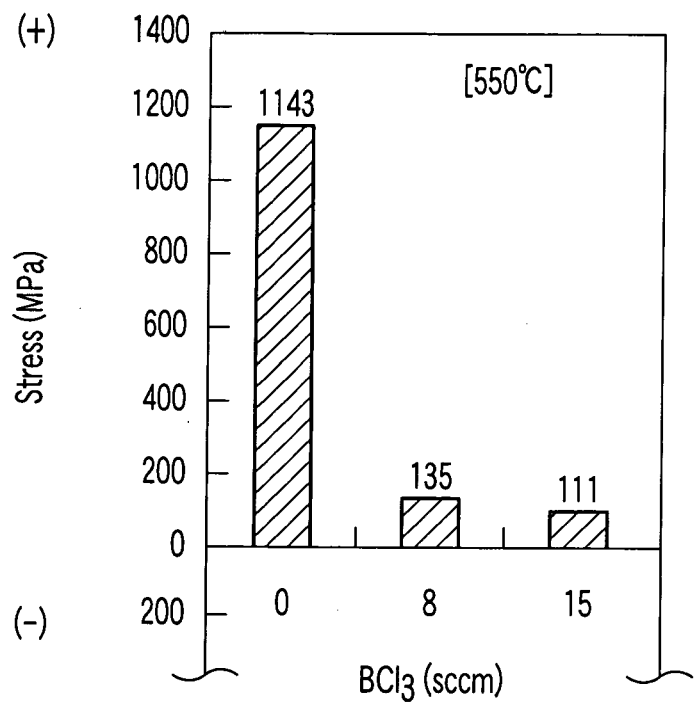
F I G. 11A
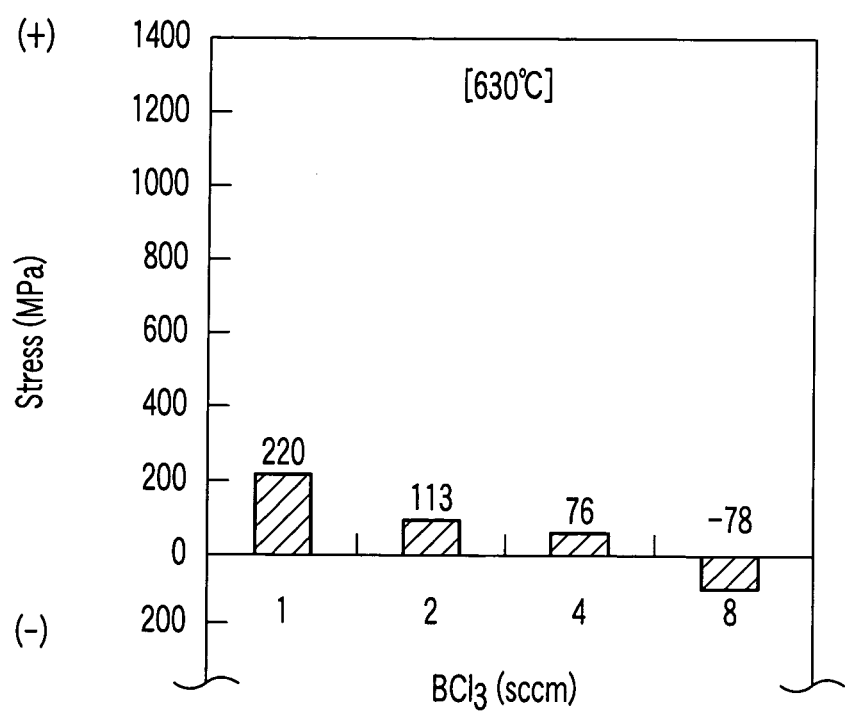
F I G. 11B

FILM FORMATION METHOD AND APPARATUS FOR SEMICONDUCTOR PROCESS FOR FORMING A SILICON NITRIDE FILM

CROSS-REFERENCE TO RELATED APPLICATIONS

This application is based upon and claims the benefit of priority from the prior Japanese Patent Applications No. 2004-220555, filed Jul. 28, 2004; No. 2005-048060, filed Feb. 23, 2005; and No. 2005-177344, filed Jun. 17, 2005, the entire contents of all of which are incorporated herein by reference.

BACKGROUND OF THE INVENTION

1. Field of the Invention

The present invention relates to a film formation method and apparatus for a semiconductor process for forming a film of silicon nitride or silicon oxynitride doped with an impurity on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. Jpn. Pat. Appln. KOKAI Publication No. 2004-6801 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat-process is performed, while the process conditions, such as process gas flow rate, process pressure, and process temperature, are controlled.

Conventionally, silicon oxide films ($SiO_2$ films) are mainly used as insulating films for semiconductor devices. However, in recent years, owing to the demands of increased integration and miniaturization of semiconductor integrated circuits, silicon nitride films ($Si_3N_4$ films) are used in place of silicon oxide films, as usage. For example, silicon nitride films are disposed as films resistant to oxidation, films for preventing impurity diffusion, and sidewall films of gate electrode structures. Since silicon nitride films provide a low coefficient of impurity diffusion and a good barrier property against oxidation, they are very suitable as insulating films for the purpose described above.

On the other hand, in recent years, increasing the operation speed of semiconductor devices is also an important factor. In this respect, silicon nitride films have a relatively high dielectric constant, which increases parasitic capacitance and thus is problematic. Specifically, with increase in parasitic capacitance, the mobility of electrons is suppressed, so the device operation speed decreases. Further, where a silicon nitride film is used for a sensor of the charge storage type, there is a problem in that parasitic capacitance increases a background level.

Under the circumstances, it has been proposed to dope a silicon nitride film with an impurity, so as to decrease the dielectric constant while maintaining the impurity diffusion coefficient and oxidation barrier property. U.S. Pat. No. 6,815,350 discloses a method of forming a silicon nitride film doped with boron (B) as an impurity, by CVD (Chemical Vapor Deposition). Films of silicon nitride doped with boron (SiBN) have not only a low coefficient of impurity diffusion and a good barrier property against oxidation, but also a very low dielectric constant, so they are very useful as insulating films.

However, silicon nitride films doped with boron, which are formed by CVD, have a relatively low strength and a low etching resistance. As a consequence, for example, when dry etching is performed in a subsequent step, silicon nitride films doped with boron tend to be excessively etched.

BRIEF SUMMARY OF THE INVENTION

An object of the present invention is to provide a film formation method and apparatus for a semiconductor process, which can form a film of silicon nitride or silicon oxynitride doped with an impurity and having a low dielectric constant and a high etching resistance.

According to a first aspect of the present invention, there is provided a film formation method for a semiconductor process for forming a film of silicon nitride or silicon oxynitride doped with an impurity on a target substrate by CVD, in a process field configured to be selectively supplied with a first process gas containing a silane family gas, a second process gas containing a nitriding gas or oxynitriding gas, and a third process gas containing a doping gas, the method alternately comprising:

a first step of performing supply of the first and third process gases to the process field;

a second step of stopping supply of the first, second, and third process gases to the process field;

a third step of performing supply of the second process gas to the process field while stopping supply of the first and third process gases to the process field, the third step comprising an excitation period of supplying the second process gas to the process field while exciting the second process gas by an exciting mechanism; and a fourth step of stopping supply of the first, second, and third process gases to the process field.

According to a second aspect of the present invention, there is provided a film formation apparatus for a semiconductor process, comprising:

a process container having a process field configured to accommodate a target substrate;

a support member configured to support the target substrate inside the process field;

a heater configured to heat the target substrate inside the process field;

an exhaust system configured to exhaust gas inside the process field;

a first process gas supply circuit configured to supply a first process gas containing a silane family gas to the process field;

a second process gas supply circuit configured to supply a second process gas containing a nitriding gas or oxynitriding gas to the process field;

a third process gas supply circuit configured to supply a third process gas containing a doping gas to the process field;

an exciting mechanism configured to selectively excite the second process gas to be supplied to the process field; and a control section configured to control an operation of the apparatus, wherein, in order to form a film of silicon nitride or silicon oxynitride doped with an impurity on the target substrate by CVD, the control section alternately executes a first step of performing supply of the first and third process gases to the process field;

a second step of stopping supply of the first, second, and third process gases to the process field;

a third step of performing supply of the second process gas to the process field while stopping supply of the first and third process gases to the process field, the third step comprising an excitation period of supplying the second process gas to the process field while exciting the second process gas by the exciting mechanism; and a fourth step of stopping supply of the first, second, and third process gases to the process field.

According to a third aspect of the present invention, there is provided a computer readable medium containing program instructions for execution on a processor, which is used for a film formation apparatus for a semiconductor process for forming a film of silicon nitride or silicon oxynitride doped with an impurity on a target substrate by CVD, in a process field configured to be selectively supplied with a first process gas containing a silane family gas, a second process gas containing a nitriding gas or oxynitriding gas, and a third process gas containing a doping gas, wherein the program instructions, when executed by the processor, cause the film formation apparatus to execute a first step of performing supply of the first and third process gases to the process field;

a second step of stopping supply of the first, second, and third process gases to the process field;

a third step of performing supply of the second process gas to the process field while stopping supply of the first and third process gases to the process field, the third step comprising an excitation period of supplying the second process gas to the process field while exciting the second process gas by an exciting mechanism; and a fourth step of stopping supply of the first, second, and third process gases to the process field.

In the first to third aspects, the first process gas may contain at least one gas selected from the group consisting of dichlorosilane (DCS), hexachlorodisilane (HCD), monosilane ($SiH_4$), disilane ($Si_2Cl_6$), hexamethyldisilazane (HMDS), tetrachlorosilane (TCS), disilylamine (DSA), trisilylamine (TSA), and bistertialbutylaminosilane (BTBAS). The second process gas may contain at least one gas selected from the group consisting of ammonia ($NH_3$), nitrogen ($N_2$), dinitrogen oxide ($N_2O$), and nitrogen oxide (NO). The doping gas may contain at least one gas selected from the group consisting of $BCl_3$, $B_2H_6$, $BF_3$, and $B(CH_3)_3$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a sectional plan view showing part of the apparatus shown in FIG. 1;

FIGS. 11A and 11B are graphs showing the relationship between the flow rate of $BCl_3$ gas and film stress.

DETAILED DESCRIPTION OF THE INVENTION

Figure 1:
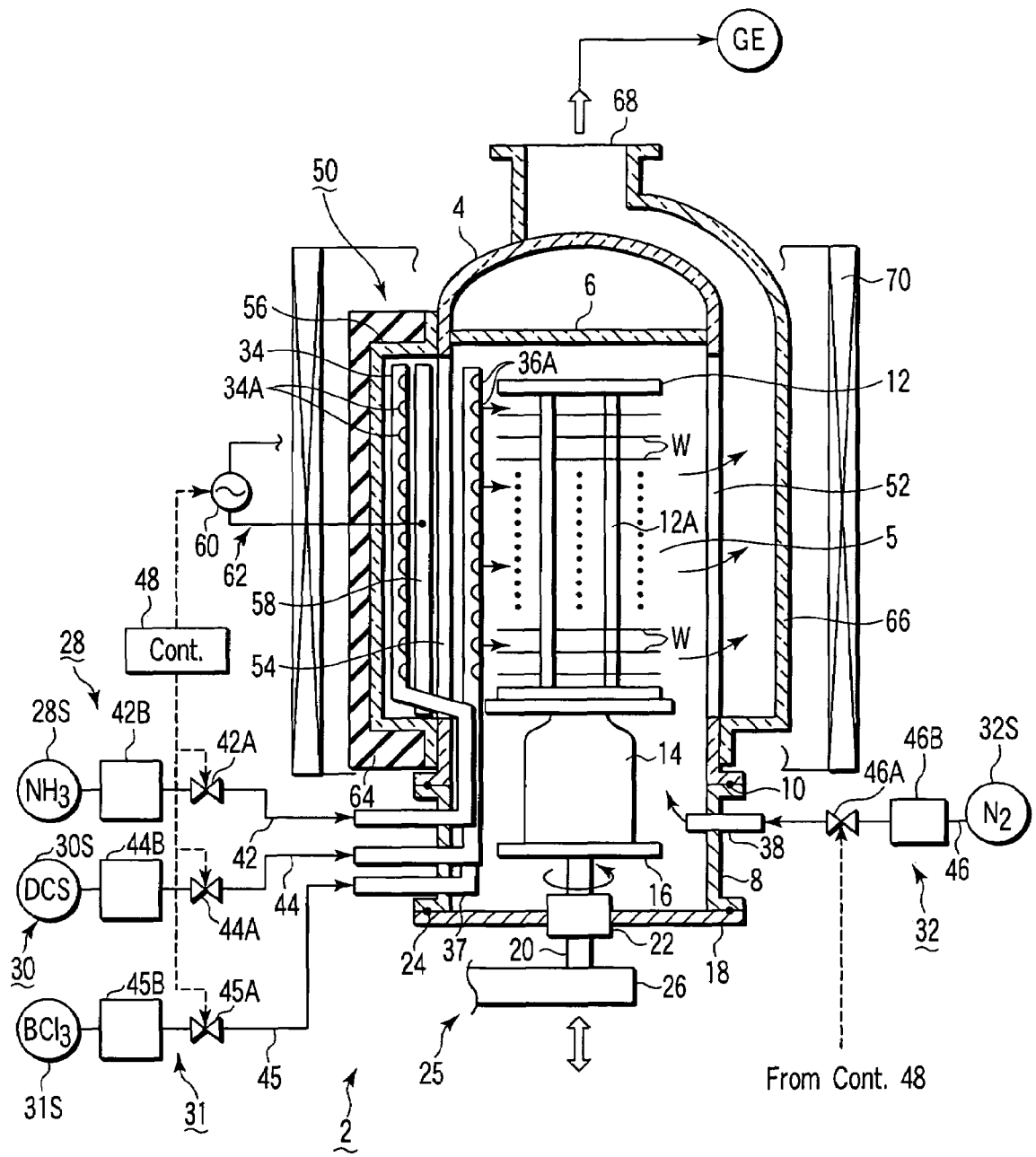
FIG. 1 is a sectional view showing a film formation apparatus (vertical CVD apparatus) according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

FIG. 1 is a sectional view showing a film formation apparatus (vertical CVD apparatus) according to an embodiment of the present invention. FIG. 2 is a sectional plan view showing part of the apparatus shown in FIG. 1. The film formation apparatus 2 is arranged to supply a first process gas (source gas) containing dichlorosilane (DCS) gas as a silane family gas, a second process gas (assist gas) containing ammonia ($NH_3$) gas as a nitriding gas, and a third process gas (supplemental gas) containing $BCl_3$ gas as a doping gas to form a film of silicon nitride doped with boron as an impurity (SiBN), on the wafers W by CVD.

The apparatus 2 includes a process container 4 shaped as a cylindrical column with a ceiling and an opened bottom, in which a process field 5 is defined to accommodate and process a plurality of semiconductor wafers (target substrates) stacked at intervals. The entirety of the process container 4 is made of, e.g., quartz. The top of the process container 4 is provided with a quartz ceiling plate 6 to airtightly seal the top.

The bottom of the process container 4 is connected through a seal member 10, such as an O-ring, to a cylindrical manifold 8.

The cylindrical manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes an assist gas supply circuit (second process gas supply circuit) 28, a source gas supply circuit (first process gas supply circuit) 30, a supplemental gas supply circuit (third process gas supply circuit) 31, and a purge gas supply circuit 32. The source gas supply circuit 30 is arranged to supply a source gas containing a silane family gas, such as DCS (dichlorosilane) gas. The assist gas supply circuit 28 is arranged to supply an assist gas containing a nitriding gas, such as ammonia ($NH_3$) gas. The supplemental gas supply circuit 31 is arranged to supply a supplemental gas containing a doping gas, such as $BCl_3$ gas. The purge gas supply circuit 32 is arranged to supply an inactive gas, such as $N_2$ gas, as a purge gas. Each of the source gas, assist gas, and supplemental gas (first, second, and third process gases) is mixed with a suitable amount of carrier gas, as needed. However, such a carrier gas will not be mentioned, hereinafter, for the sake of simplicity of explanation.

More specifically, the assist gas supply circuit 28, source gas supply circuit 30, and supplemental gas supply circuit 31 include gas distribution nozzles 34, 36, and 37, respectively, each of which is formed of a quartz pipe which penetrates the sidewall of the manifold 8 from the outside and then turns and extends upward (see FIG. 2). The gas distribution nozzles 34, 36, and 37 respectively have a plurality of gas spouting holes 34A, 36A, and 37A, each set being formed at predetermined intervals in the longitudinal direction (the vertical direction) over all the wafers W on the wafer boat 12. The gas spouting holes 34A, 36A, and 37A respectively deliver the assist gas (containing $NH_3$ gas), source gas (containing DCS), and supplemental gas (containing $BCl_3$ gas) almost uniformly in the horizontal direction, so as to form gas flows parallel with the wafers W on the wafer boat 12. The purge gas supply circuit 32 includes a short gas nozzle 38, which penetrates the sidewall of the manifold 8 from the outside.

The nozzles 34, 36, 37, and 38 are connected to gas sources 28S, 30S, 31S, and 32S of $NH_3$ gas, DCS gas, $BCl_3$ gas, and $N_2$ gas, respectively, through gas supply lines (gas passages) 42, 44, 45, and 46, respectively. The gas supply lines 42, 44, 45, and 46 are provided with switching valves 42A, 44A, 45A, and 46A and flow rate controllers 42B, 44B, 45B, and 46B, such as mass flow controllers, respectively. With this arrangement, $NH_3$ gas, DCS gas, $BCl_3$ gas, and $N_2$ gas can be supplied at controlled flow rates.

A gas exciting section 50 is formed at the sidewall of the process container 4 in the vertical direction. On the side of the process container 4 opposite to the gas exciting section 50, a long and thin exhaust port 52 for vacuum-exhausting the inner atmosphere is formed by cutting the sidewall of the process container 4 in, e.g., the vertical direction.

Specifically, the gas exciting section 50 has a vertically long and thin opening 54 formed by cutting a predetermined width of the sidewall of the process container 4, in the vertical direction. The opening 54 is covered with a quartz cover 56 airtightly connected to the outer surface of the process container 4 by welding. The cover 56 has a vertical long and thin shape with a concave cross-section, so that it projects outward from the process container 4.

With this arrangement, the gas exciting section 50 is formed such that it projects outward from the sidewall of the process container 4 and is opened on the other side to the interior of the process container 4. In other words, the inner space of the gas exciting section 50 communicates with the process field 5 within the process container 4. The opening 54 has a vertical length sufficient to cover all the wafers W on the wafer boat 12 in the vertical direction.

A pair of long and thin electrodes 58 are disposed on the opposite outer surfaces of the cover 56, and face each other along the longitudinal direction (the vertical direction). The electrodes 58 are connected to an RF (Radio Frequency) power supply 60 for plasma generation, through feed lines 62. An RF voltage of, e.g., 13.56 MHz is applied to the electrodes 58 to form an RF electric field for exciting plasma between the electrodes 58. The frequency of the RF voltage is not limited to 13.56 MHz, and it may be set at another frequency, e.g., 400 kHz.

The gas distribution nozzle 34 of the assist gas (second process gas) is bent outward in the radial direction of the process container 4, at a position lower than the lowermost wafer W on the wafer boat 12. Then, the gas distribution nozzle 34 vertically extends at the deepest position (the farthest position from the center of the process container 4) in the gas exciting section 50. As shown also in FIG. 2, the gas distribution nozzle 34 is separated outward from an area sandwiched between the pair of electrodes 58 (a position where the RF electric field is most intense), i.e., a plasma generation area PS where the main plasma is actually generated. The second process gas containing $NH_3$ gas is spouted from the gas spouting holes 34A of the gas distribution nozzle 34 toward the plasma generation area PS. Then, the second process gas is excited (decomposed or activated) in the plasma generation area PS, and is supplied in this state onto the wafers W on the wafer boat 12.

An insulating protection cover 64 made of, e.g., quartz is attached on and covers the outer surface of the cover 56. A cooling mechanism (not shown) is disposed in the insulating protection cover 64 and comprises coolant passages respectively facing the electrodes 58. The coolant passages are supplied with a coolant, such as cooled nitrogen gas, to cool the electrodes 58. The insulating protection cover 64 is covered with a shield (not shown) disposed on the outer surface to prevent RF leakage.

The gas distribution nozzles 36 and 37 of the source gas (first process gas) and supplemental gas (third process gas) extend upward and face each other at positions near and outside the opening 54 of the gas exciting section 50, i.e., on both sides of the outside of the opening 54 (in the process container 4). The source gas containing DCS gas and the supplemental gas containing $BCl_3$ gas are spouted from the gas spouting holes 36A and 37A of the gas distribution nozzles 36 and 37, respectively, toward the center of the process container 4.

On the other hand, the exhaust port 52, which is formed opposite the gas exciting section 50, is covered with an exhaust port cover member 66. The exhaust port cover member 66 is made of quartz with a U-shape cross-section, and attached by welding. The exhaust cover member 66 extends upward along the sidewall of the process container 4, and has a gas outlet 68 at the top of the process container 4. The gas outlet 68 is connected to a vacuum-exhaust system GE including a vacuum pump and so forth.

The process container 4 is surrounded by a heater 70, which is used for heating the atmosphere within the process container 4 and the wafers W. A thermocouple (not shown) is disposed near the exhaust port 52 in the process container 4 to control the heater 70.

The film formation apparatus 2 further includes a main control section 48 formed of, e.g., a computer, to control the entire apparatus. The main control section 48 can control the film formation process described below in accordance with the process recipe of the film formation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 48 can control the elevating mechanism 25, gas supply circuits 28, 30, 31, and 32, exhaust system GE, gas exciting section 50, heater 70, and so forth, based on the stored process recipe and control data.

Next, an explanation will be given of a film formation method (so called ALD (Atomic Layer Deposition) film formation) performed in the apparatus shown in FIG. 1. In summary, this film formation method is arranged to supply a first process gas (source gas) containing dichlorosilane (DCS) gas as a silane family gas, a second process gas (assist gas) containing ammonia ($NH_3$) gas as a nitriding gas, and a third process gas (supplemental gas) containing $BCl_3$ gas as a doping gas to the process field 5 accommodating wafers W to form a film of silicon nitride doped with boron as an impurity (SiBN), on the wafers W by CVD.

At first, the wafer boat 12 at room temperature, which supports a number of, e.g., 50 to 100, wafers having a diameter of 300 mm, is loaded into the process container 4 heated at a predetermined temperature. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, the source gas containing DCS gas, the assist gas containing $NH_3$ gas, and the supplemental gas containing $BCl_3$ gas are intermittently supplied from the respective gas distribution nozzles 36, 34, and 37 at controlled flow rates.

Specifically, the source gas containing DCS gas and the supplemental gas containing $BCl_3$ gas are supplied from the gas spouting holes 36A and 37A of the gas distribution nozzles 36 and 37, respectively, to form gas flows parallel with the wafers W on the wafer boat 12. While being supplied, molecules of DCS gas and $BCl_3$ gas and molecules and atoms of decomposition products generated by their decomposition are adsorbed on the wafers W.

On the other hand, the assist gas containing $NH_3$ gas is supplied from the gas spouting holes 36A of the gas distribution nozzle 34 to form gas flows parallel with the wafers W on the wafer boat 12. The assist gas is selectively excited and partly turned into plasma when it passes through the plasma generation area PS between the pair of electrodes 58. At this time, for example, radicals (activated species), such as N*, NH*, $NH_2$*, and $NH_3$*, are produced (the symbol [*] denotes that it is a radical). The radicals flow out from the opening 54 of the gas exciting section 50 toward the center of the process container 4, and are supplied into gaps between the wafers W in a laminar flow state.

The radicals react with molecules of DCS gas adsorbed on the surface of the wafers W, so that a silicon nitride film is formed on the wafers W. Further, at this time, B atoms generated by decomposition of $BCl_3$ gas are taken into the silicon nitride film, so a film of silicon nitride doped with boron as an impurity (SiBN) is formed. Alternatively, when DCS gas and $BCl_3$ gas flow onto radicals adsorbed on the surface of the wafers W, the same reaction is caused, so a silicon nitride film doped with boron is formed on the wafers W.

First Embodiment

Figure 3:
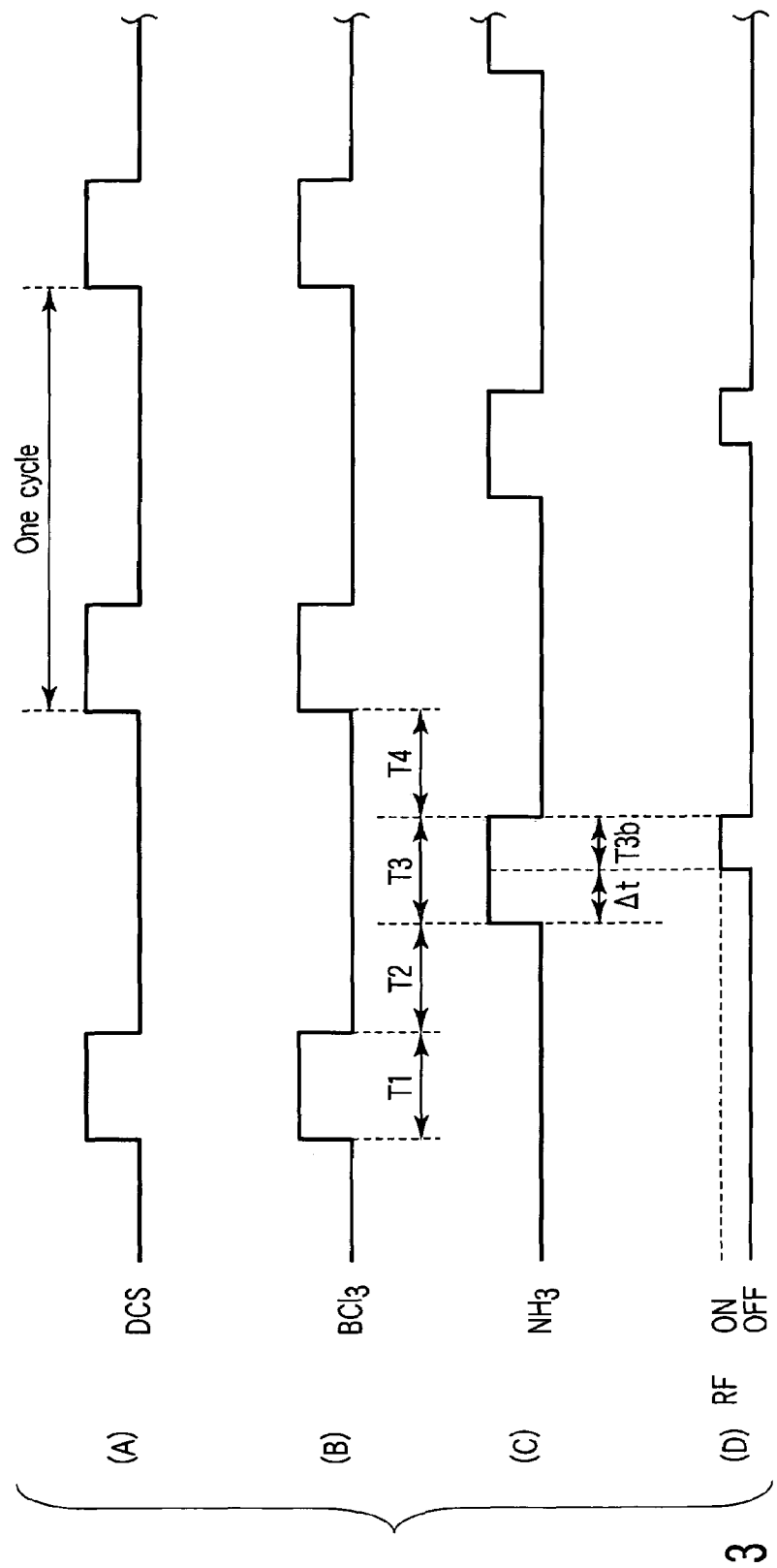
FIG. 3 is a timing chart of the gas supply and RF (radio frequency) application of a film formation method according to a first embodiment of the present invention.

FIG. 3 is a timing chart of the gas supply and RF (radio frequency) application of a film formation method according to a first embodiment of the present invention. As shown in FIG. 3, the film formation method according to this embodiment is arranged to alternately repeat first to fourth steps T1 to T4. A cycle comprising the first to fourth steps T1 to T4 is repeated a number of times, and thin films of silicon nitride doped with boron formed by respective cycles are laminated, thereby arriving at a silicon nitride film having a target thickness.

Specifically, the first step T1 is arranged to perform supply of the source gas (denoted as DCS in FIG. 3) and the supplementary gas (denoted as $BCl_3$ in FIG. 3) to the process field 5, while stopping supply of the assist gas (denoted as $NH_3$ in FIG. 3) to the process field 5. The second step T2 is arranged to stop supply of the source gas, assist gas, and supplementary gas to the process field 5. The third step T3 is arranged to perform supply of the assist gas to the process field 5, while stopping supply of the source gas and supplementary gas to the process field 5. Further, halfway through the third step T3, the RF power supply 60 is set in the ON state to turn the assist gas into plasma by the gas exciting section 50, so as to supply the assist gas in an activated state to the process field 5 during a sub-step T3b. The fourth step T4 is arranged to stop supply of the source gas, assist gas, and supplementary gas to the process field 5.

Each of the second and fourth steps T2 and T4 is used as a purge step to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while stopping supply of all the gases. In this respect, the second and fourth steps T2 and T4 may be arranged such that the first half utilizes only vacuum-exhaust and the second half utilizes both vacuum-exhaust and inactive gas supply. Further, the first and third steps T1 and T3 may be arranged to stop vacuum-exhausting the process container 4 while supplying each of the source gas, assist gas, and supplementary gas. However, where supplying each of the source gas, assist gas, and supplementary gas is performed along with vacuum-exhausting the process container 4, the interior of the process container 4 can be continuously vacuum-exhausted over the entirety of the first to fourth steps T1 to T4.

In FIG. 3, the first step T1 is set to be within a range of about 1 to 20 seconds, and, for example, at about 10 seconds, the second step T2 is set to be within a range of about 5 to 15 seconds, and, for example, at about 10 seconds, the third step T3 is set to be within a range of about 1 to 30 seconds, and, for example, at about 20 seconds, the sub-step T3b is set to be within a range of about 1 to 25 seconds, and, for example, at about 15 seconds, and the fourth step T4 is set to be within a range of about 5 to 15 seconds, and, for example, at about 10 seconds. In general, the film thickness obtained by one cycle of the first to fourth steps T1 to T4 is about 0.11 to 0.13 nm. Accordingly, for example, where the target film thickness is 70 nm, the cycle is repeated about 600 times. However, these values of time and thickness are merely examples and thus are not limiting.

As described above, the step T1 of simultaneously supplying the source gas containing DCS gas and the supplemental gas containing $BCl_3$ gas, and the step T3 of solely supplying the assist gas containing $NH_3$ gas and including a period of exciting the gas by plasma are alternately performed with the purge steps T2 and T4 respectively interposed therebetween. This makes it possible to greatly reduce the dielectric constant of a silicon nitride film doped with boron to be formed, and to greatly improve the etching resistance of the film in dry etching. This is thought to be caused for the following reason. Specifically, in general, where a silicon nitride film is doped with boron, the etching resistance thereof is deteriorated. However, as in the first embodiment, where the assist gas is excited by plasma when it is supplied, radicals (activated species) containing N radicals are generated and promote nitridation of a silicon nitride film. As a consequence, the number of Si—H bonds decreases while the number of Si—N bonds, which have high etching resistance, increases, in the silicon nitride film. As a consequence, the etching resistance of the film is greatly improved.

In the third step T3, the RF power supply 60 is turned on after a predetermined time $\Delta t$ passes, to turn the assist gas into plasma by the gas exciting section 50, so as to supply the assist gas in an activated state to the process field 5 during the sub-step T3b. The predetermined time $\Delta t$ is defined as the time necessary for stabilizing the flow rate of $NH_3$ gas, which is set at, e.g., about 5 seconds. However, the assist gas may be turned into plasma by the gas exciting section 50 over the entire period of supplying the assist gas. Since the RF power supply is turned on to generate plasma after the flow rate of the assist gas is stabilized, the uniformity of radical concentration among the wafers W (uniformity in the vertical direction) is improved.

The process conditions of the film formation process are as follows. The flow rate of DCS gas is set to be within a range of 50 to 3,000 sccm, e.g., at 1,000 sccm (1 slm). The flow rate of $NH_3$ gas is set to be within a range of 500 to 5,000 sccm, e.g., at 1,000 sccm. The flow rate of $BCl_3$ gas is set to be within a range of 1 to 100 sccm, and preferably a range of 1 to 15 sccm, e.g., at 4 sccm. The process temperature is lower than ordinary CVD processes, and is set to be within a range of 300 to 700° C., and preferably a range of 550 to 630° C. If the process temperature is lower than 300° C., essentially no film is deposited because hardly any reaction is caused. If the process temperature is higher than 700° C., a low quality CVD film is deposited, and a thermal damage is applied to existing films, such as a metal film.

The process pressure is set to be within a range of 13 Pa (0.1 Torr) to 1,330 Pa (10 Torr), and preferably a range of 40 Pa (0.3 Torr) to 266 Pa (2 Torr). For example, the process pressure is set at 1 Torr during the first step (adsorption step) T1, and at 0.3 Torr during the third step (nitridation step using plasma) T3. If the process pressure is lower than 13 Pa, the film formation rate becomes lower than the practical level. If the process pressure is higher than 1,330 Pa, it becomes difficult to generate plasma.

<Experiment 1>

Using the apparatus shown in FIG. 1, a film of silicon nitride doped with boron (SiBN) was formed by a film formation method according to the first embodiment with the timing chart shown in FIG. 3, and the film thus formed was then examined. In this experiment 1, the process conditions described above were employed as the reference for the film formation process. In the following explanation, conditions used as parameters will be mentioned.

[Relationship Between Flow Rate of $BCl_3$ Gas and Dielectric Constant]

In order to study this matter, the process temperature was set at three different values of 550° C., 600° C., and 630° C. The flow rate of $BCl_3$ gas was set at different values within a range of 0 to 8 sccm.

Figure 4:
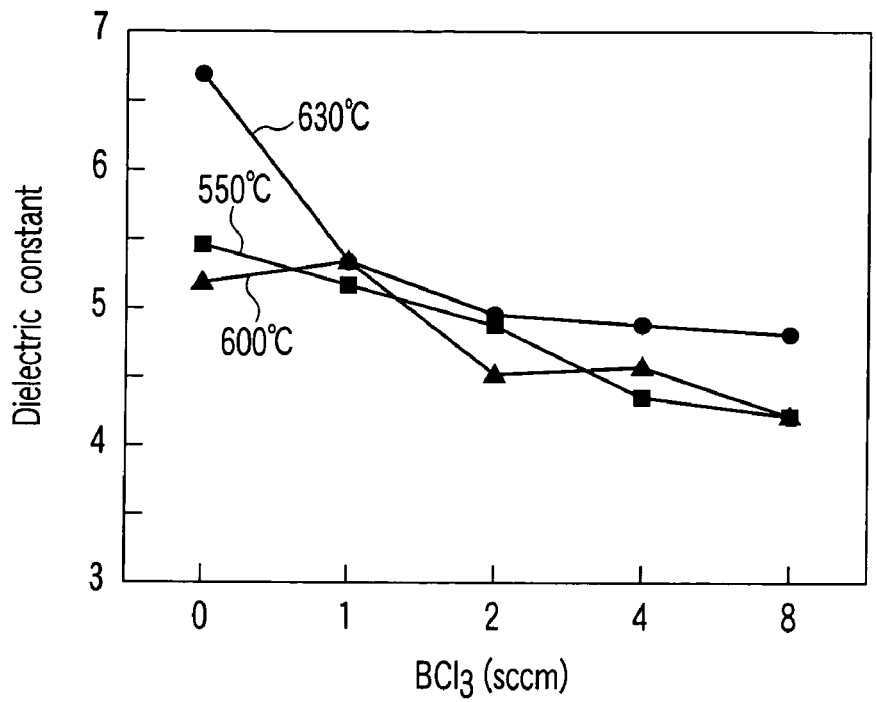
FIG. 4 is a graph showing the relationship between the flow rate of $BCl_3$ gas and dielectric constant.

FIG. 4 is a graph showing the relationship between the flow rate of $BCl_3$ gas and dielectric constant. As shown in FIG. 4, regardless of the process temperature, the dielectric constant of the SiBN film decreased with increase in the flow rate of $BCl_3$ gas. Accordingly, it has been confirmed that an SiBN film formed by the film formation method according to the first embodiment has a dielectric constant that decreases (i.e., thereby reducing the parasitic capacitance of a semiconductor device) with increase in boron concentration. The dielectric constant is preferably set at 5 or less.

[Relationship Between Refractive Index of SiBN Film and Dielectric Constant]

Figure 5:
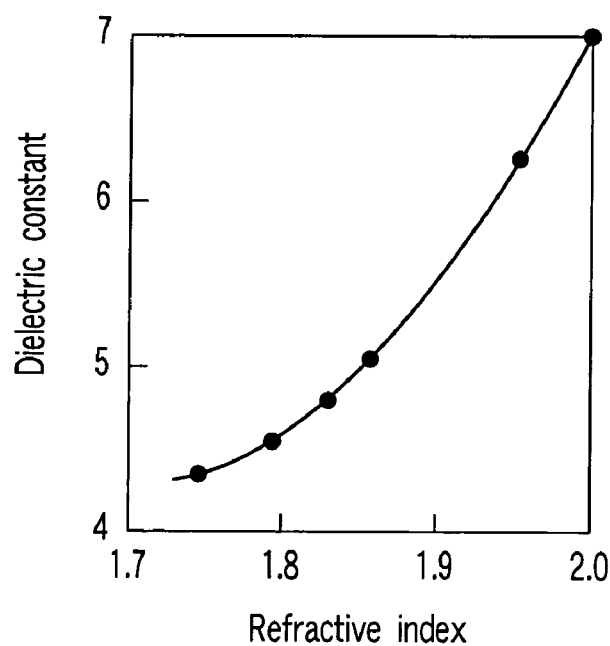
FIG. 5 is a graph showing the relationship between the refractive index of an SiBN film and dielectric constant.

FIG. 5 is a graph showing the relationship between the refractive index of an SiBN film and dielectric constant. As shown in FIG. 5, the dielectric constant changed from 7 to about 4 with change of the refractive index from 2 to about 1.7.

[Relationship Between Refractive Index and Etching Rate]

In order to study this matter, etching was performed on an SiBN film, using three different etching liquids, i.e., purified water [DIW], diluted sulfuric acid solution [SPM] ($H_2SO_4$: $H_2O_2$=4:1), and diluted hydrofluoric acid solution [DHF] (HF:$H_2O$=1:99). The etching was performed at 60° C. for 20 minutes for DIW, at 100° C. for 2 minutes for SPM, and at 23° C. for 5 minutes for DHF. Then, the etching rate per minute was calculated for each etching liquid.

Figure 6:
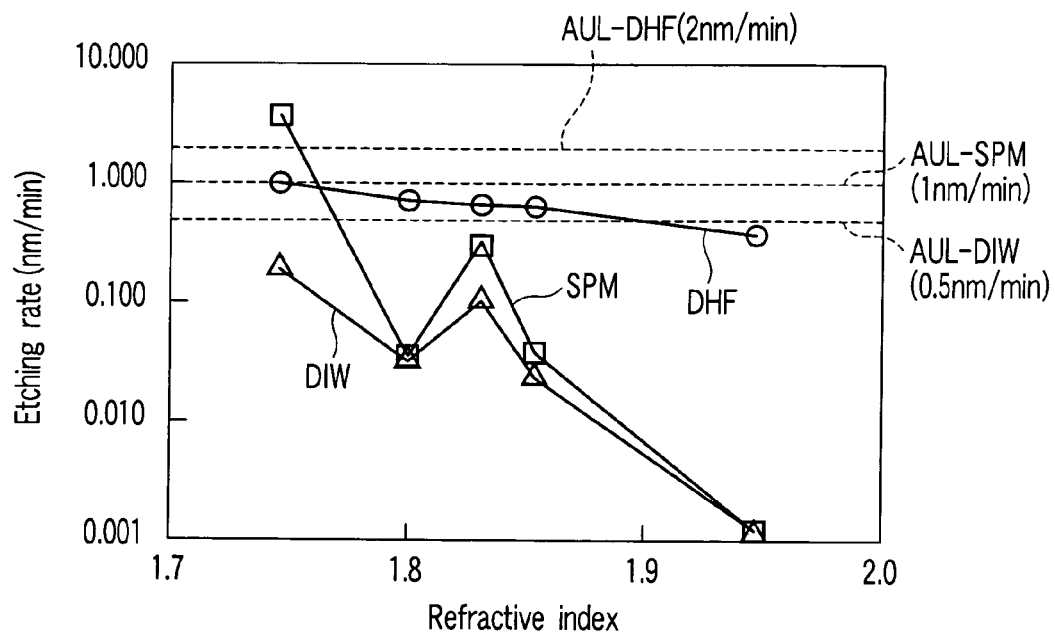
FIG. 6 is a graph showing the relationship between the refractive index and etching rate.

FIG. 6 is a graph showing the relationship between the refractive index of an SiBN film and etching rate. FIG. 6 also shows acceptable upper limits AUL representing the resistance against the respective etching liquids. Specifically, the acceptable upper limit AUL-DHF for DHF is 2 nm/min, the acceptable upper limit AUL-SPM for SPM is 1 nm/min, and the acceptable upper limit AUL-DIW for DIW is 0.5 nm/min.

As shown in FIG. 6, the etching rate gradually increased with decrease in the refractive index, although there was a large fluctuation of the etching rate when the refractive index was at about 1.85. In other words, the etching rate gradually increased with decrease in the dielectric constant due to increase in the boron content (see FIGS. 4 and 5). Except for the case where the SPM etching liquid was used when the refractive index was at about 1.75, the etching rates obtained by the etching liquids described above were lower than the acceptable upper limits. Accordingly, it has been confirmed that an SiBN film formed by the film formation method according to the first embodiment can have sufficient etching resistance against the etching liquids described above.

[Relationship Between Flow Rate of $BCl_3$ Gas and Etching Rate]

In order to study this matter, etching was performed on an SiBN film, using the three different etching liquids described above, i.e., purified water [DIW], diluted sulfuric acid solution [SPM], and diluted hydrofluoric acid solution [DHF]. The etching conditions were set to be the same as those described above. The SiBN film used as an etching target was formed at a process temperature of 630° C. The flow rate of $BCl_3$ gas was set at different values within a range of 0 to 8 sccm.

Figure 7:
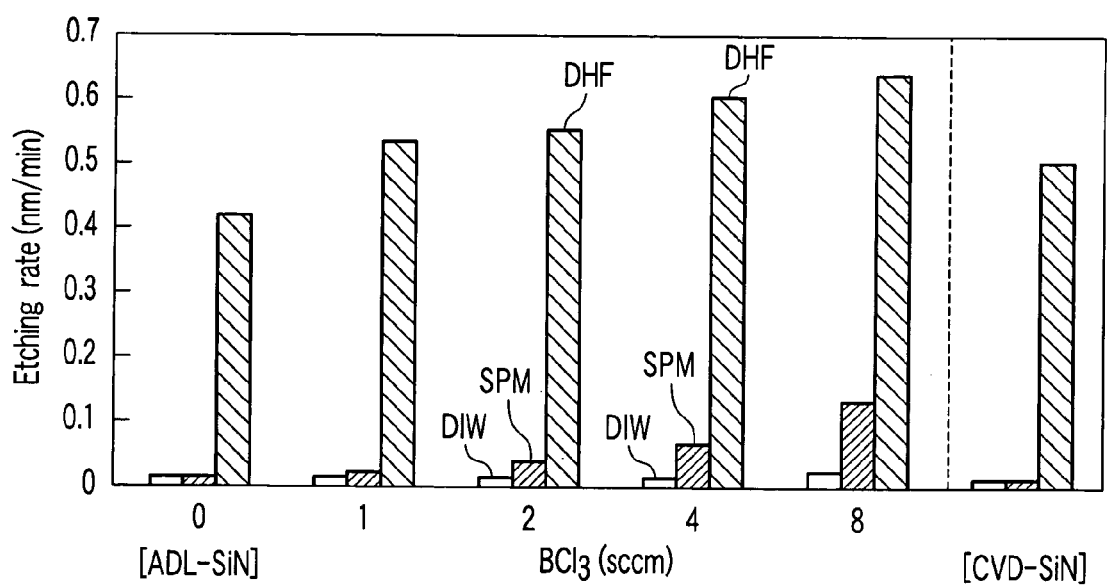
FIG. 7 is a graph showing the relationship between the flow rate of $BCl_3$ gas and etching rate.

FIG. 7 is a graph showing the relationship between the flow rate of $BCl_3$ gas and etching rate. In FIG. 7, etching rates obtained by the three different etching liquid are shown at each value of the flow rate of $BCl_3$ gas. They are etching rates for DIW, SPM, and DHF, in this order from left to right. The data shown at $BCl_3$=0 sccm, on the left side in FIG. 7, corresponds to an SiN film formed by ALD and not doped with boron (ALD-SiN). Furtherer, for the purpose of reference, etching rates of an SiN film formed by CVD and not doped with boron (CVD-SiN) are shown on the right side in FIG. 7.

The acceptable upper limits against the respective etching liquids are the same as those explained with reference to FIG. 6. Specifically, they are 2 nm/min for DHF, 1 nm/min for SPM, and 0.5 nm/min for DIW.

As shown in FIG. 7, the etching rate obtained by each of DHF, SPM, and DIW gradually increased with increase in the flow rate of $BCl_3$ gas from 1 sccm to 8 sccm. For example, in the case of DHF, the etching rate increased from about 0.55 nm/min to 0.65 nm/min. In the case of SPM, the etching rate increased from about 0.02 nm/min to 0.14 nm/min. In the case of DIW, the etching rate increased from about 0.01 nm/min to 0.02 nm/min. However, the values of the etching rate obtained by each of DHF, SPM, and DIW were far smaller than the corresponding acceptable upper limit. Accordingly, it has been confirmed that an SiBN film formed by the film formation method according to the first embodiment can have sufficient etching resistance against the etching liquids described above.

[SiBN Film Step Coverage]

An SiBN film formed by the film formation method according to the first embodiment was further examined in terms of its step coverage. As a consequence, it has been confirmed that the SiBN film shows sufficiently high step coverage, such as 97 to 105%.

Second Embodiment

Figure 8:
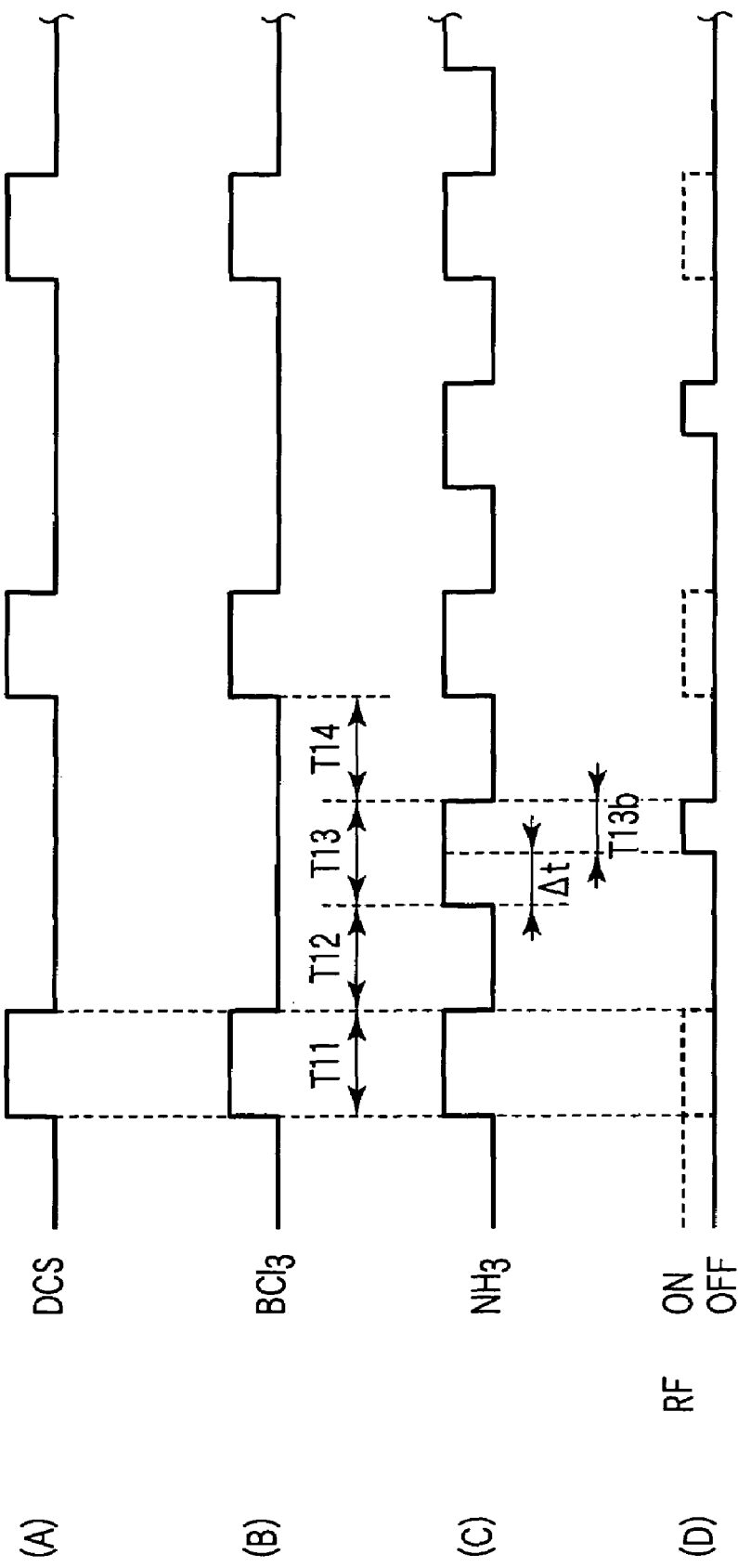
FIG. 8 is a timing chart of the gas supply and RF (radio frequency) application of a film formation method according to a second embodiment of the present invention.

FIG. 8 is a timing chart of the gas supply and RF (radio frequency) application of a film formation method according to a second embodiment of the present invention. As shown in FIG. 8, the film formation method according to this embodiment is also arranged to alternately repeat first to fourth steps T11 to T14. A cycle comprising the first to fourth steps T11 to T14 is repeated a number of times, and thin films of silicon nitride doped with boron formed by respective cycles are laminated, thereby arriving at a silicon nitride film having a target thickness.

Specifically, the first step T11 is arranged to perform supply of the source gas (denoted as DCS in FIG. 8), the assist gas (denoted as $NH_3$ in FIG. 8), and the supplementary gas (denoted as $BCl_3$ in FIG. 8) to the process field 5. The second step T12 is arranged to stop supply of the source gas, assist gas, and supplementary gas to the process field 5. The third step T13 is arranged to perform supply of the assist gas to the process field 5, while stopping supply of the source gas and supplementary gas to the process field 5. Further, halfway through the third step T13, the RF power supply 60 is set in the ON state to turn the assist gas into plasma by the gas exciting section 50, so as to supply the assist gas in an activated state to the process field 5 during a sub-step T13b. The fourth step T14 is arranged to stop supply of the source gas, assist gas, and supplementary gas to the process field 5.

Each of the second and fourth steps T12 and T14 is used as a purge step to remove the residual gas within the process container 4. Further, the first and third steps T11 and T13 may be arranged to stop vacuum-exhausting the process container 4 while supplying each of the source gas, assist gas, and supplementary gas. However, where supplying each of the source gas, assist gas, and supplementary gas is performed along with vacuum-exhausting the process container 4, the interior of the process container 4 can be continuously vacuum-exhausted over the entirety of the first to fourth steps T11 to T14. The lengths of the first to fourth steps T11 to T14 are set to be the same as those of the first embodiment.

As described above, the first step T11 is arranged to supply, together with the source gas and supplemental gas, the assist gas containing $NH_3$ gas. This makes it possible to greatly increase the film formation rate of a silicon nitride film, while maintaining a high film quality. The reason for this is thought to be as follows. Specifically, when the assist gas and source gas are simultaneously supplied in the first step T11, DCS gas molecules adsorbed on the wafer surface are partly and incompletely nitrided by $NH_3$ gas concurrently supplied. In this case, the adsorption of DCS gas and $BCl_3$ gas molecules proceeds without reaching saturation, and thus the amount of adsorbed DCS gas and $BCl_3$ gas molecules in the first step T11 becomes higher than in a case where the source gas and so forth are solely supplied). Then, in the third step T13, the incompletely reacted portions are completely reacted with $NH_3$ gas excited by plasma, thereby forming a silicon nitride film with a high film formation rate.

In the first step T11, the flow rate of $NH_3$ gas should not be excessive, and is set to be, e.g., less than the flow rate of DCS gas, and preferably at 1/100 to 1/1 thereof. If the flow rate of $NH_3$ gas is too high, a large amount of ammonium chloride is generated, which brings about a problem in that piping lines of the exhaust system are clogged or particles of ammonium chloride are generated. Further, ammonium chloride thus generated can easily react with $BCl_3$, and a BN film containing no Si components or very few Si components is formed. On the other hand, if the flow rate of $NH_3$ gas is too low, the effect obtained by simultaneously supplying $NH_3$ gas becomes very small.

Also in the first step T11, the RF power supply 60 may be set in the ON state to turn the assist gas containing $NH_3$ gas into plasma by the gas exciting section 50 (as indicated by broken lines in FIG. 8, (D)). In this case, adsorption of DCS gas and $BCl_3$ gas onto the wafer surface is further promoted, and thus the film formation rate is improved by that much.

<Experiment 2>

Using the apparatus shown in FIG. 1, a film of silicon nitride doped with boron (SiBN) was formed by a film formation method according to each of the first and second embodiments with the timing charts shown in FIGS. 3 and 8, respectively, to compare their film formation rates. In this experiment 2, the same process conditions as in the experiment 1 were employed as the reference for the film formation process. Further, the flow rate of $NH_3$ gas was set at 100 sccm, which was 1/10 of the flow rate of DCS gas, in the first step T11 of the film formation method according to the second embodiment.

Figure 9:
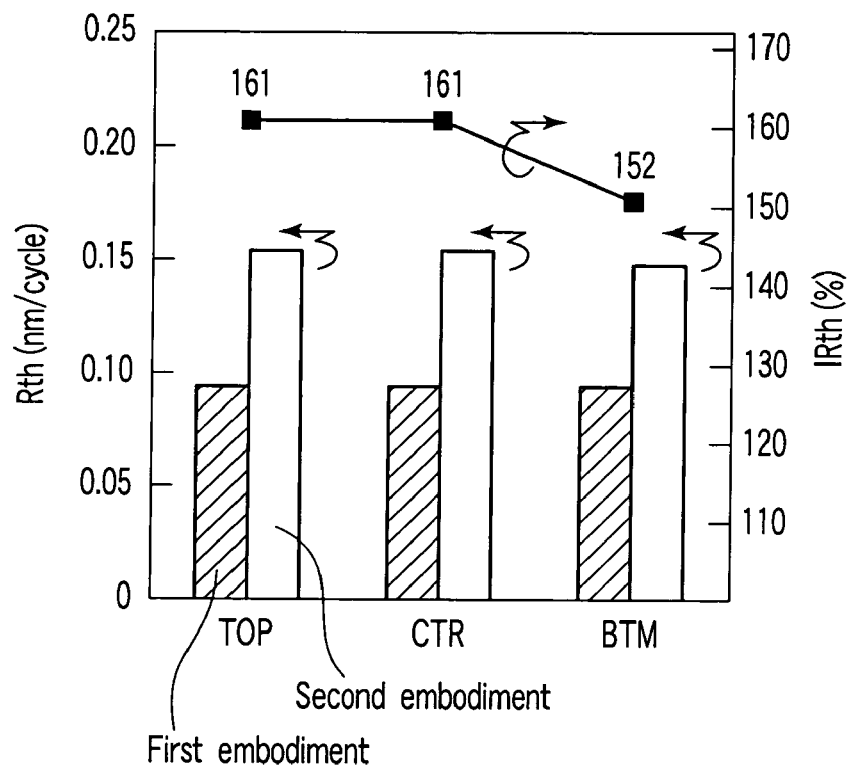
FIG. 9 is a graph showing the film formation rate and improvement ratio thereof in the film formation methods according to the first and second embodiments.

FIG. 9 is a graph showing the film formation rate Rth (nm/cycle) and improvement ratio IRth (%) thereof in the film formation methods according to the first and second embodiments. In FIG. 9, "TOP", "CTR", and "BTM" on the horizontal axis denote semiconductor wafers at top, central, and bottom positions of the wafer boat, respectively. The bars with hatching stand for the film formation rate obtained by the first embodiment, while the blank bars stand for the film formation rate obtained by the second embodiment. The improvement ratio IRth (%) is defined by [second embodiment film formation rate]/[the first embodiment film formation rate].

As shown in FIG. 9, the second embodiment method showed higher values of the film formation rate Rth than the first embodiment method, at the respective positions TOP, CTR, and BTM. The improvement ratio IRth (%) of the film formation rate was 161% at TOP, 161% at CTR, and 152% at BTM. Accordingly, it has been confirmed that, in relation to the film formation rate, the film formation method according to the second embodiment is better than the film formation method according to the first embodiment.

<Electron Mobility>

Of the properties, such as dielectric constant, etching rate, and so forth, of silicon nitride films doped with an impurity, it is also necessary to examine electron mobility (ability to move), which has a profound effect on the operation of semiconductor devices. In order to improve electron mobility, it is preferable to apply a stress to a silicon nitride film doped with an impurity. In this respect, the stress includes a tension stress (tensile stress) and a compression stress (compressive stress).

Figure 10A:
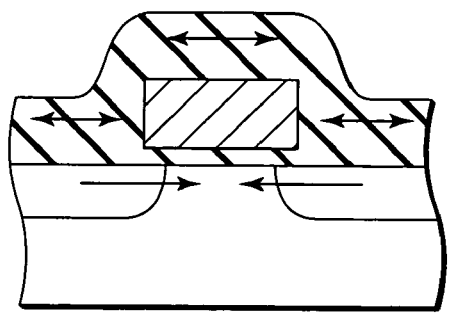
FIGS. 10A and 10B are sectional views respectively showing cross-sections of an NMOS transistor and a PMOS transistor.
Figure 10B:
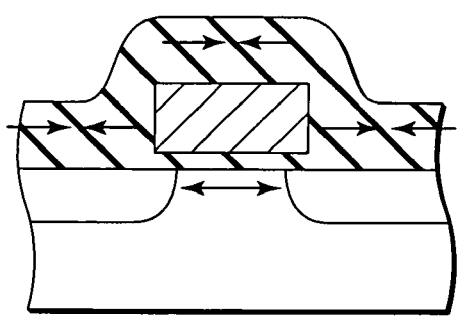

FIGS. 10A and 10B are sectional views respectively showing cross-sections of an NMOS transistor and a PMOS transistor. In FIGS. 10A and 10B, arrows denote the directions of pressure. In the case of the NMOS transistor shown in FIG. 10A, it is preferable to apply a compressive stress to the channel region. In this case, the cover film of the transistor is formed of a film having a high tensile stress. On the other hand, in the case of the PMOS transistor shown in FIG. 10B, it is preferable to apply a tensile stress to the channel region. In this case, the cover film of the transistor is formed of a film having a high compressive stress. However, according to conventional techniques, it is difficult to form a silicon nitride film doped with an impurity and having a compressive stress, and also difficult to control the level of the stress.

The present inventors studied this matter and have found that the stress of a silicon nitride film doped with an impurity can be controlled in terms of the level and type of the stress, by controlling the flow rate of a doping gas supplied in film formation. Where the flow rate of a doping gas is changed, the stress applied to a silicon nitride film doped with an impurity can be changed within a range of from a compressive stress to a tensile stress. Accordingly, in the film formation method according to each of the first and second embodiments, the stress generated in a silicon nitride film doped with an impurity can be controlled, using the flow rate of a doping gas, i.e., $BCl_3$ gas, in each of the first steps T1 and T11, as a parameter.

<Experiment 3>

Using the apparatus shown in FIG. 1, a film of silicon nitride doped with boron (SiBN) was formed by a film formation method according to the first embodiment with the timing chart shown in FIG. 3, to study the relationship between the flow rate of $BCl_3$ gas and film stress. In this experiment 3, the same process conditions as the experiment 1 were employed as the reference for the film formation process. Namely, the flow rate of DCS gas was set at 1,000 sccm, and the flow rate of $NH_3$ gas was set at 1,000 sccm.

FIGS. 11A and 11B are graphs showing the relationship between the flow rate of $BCl_3$ gas and film stress. On the vertical axis of FIGS. 11A and 11B, the "+" side denotes tensile stress and the "−" side denotes compressive stress. In an experiment, the results of which are shown in FIG. 11A, the process temperature was set at 550° C., and the flow rate of $BCl_3$ gas was set at three different values of 0, 8, and 15 sccm. In an experiment, the results of which are shown in FIG. 11B, the process temperature was set at 630° C., and the flow rate of $BCl_3$ gas was set at four different values of 1, 2, 4, and 8 sccm.

In the case of FIG. 11A, where the flow rate of $BCl_3$ gas was set at "0" (no impurity dope), the stress was very high, as high as 1143 MPa. Then, where the flow rate of $BCl_3$ gas was increased to 8 and 15 sccm, the stress (tensile) was gradually lowered to 135 and 111 MPa, respectively. In the case of FIG. 11B, the stress was gradually lowered to 220, 113, and 76 MPa, with increase in the flow rate of $BCl_3$ gas. Further, where the flow rate of $BCl_3$ gas was set at 8 sccm, the stress became −78 MPa, i.e., the type of the stress was changed from tensile stress to compressive stress. Accordingly, it has been confirmed that the stress of a silicon nitride film doped with an impurity can be controlled in terms of the level and type (direction) of the stress, by controlling the process temperature and/or the flow rate of $BCl_3$ gas. It should be noted that the values of the process temperature and gas flow rate described are merely examples.

<Common Matters and Modifications of First and Second Embodiments>

Figure 12:
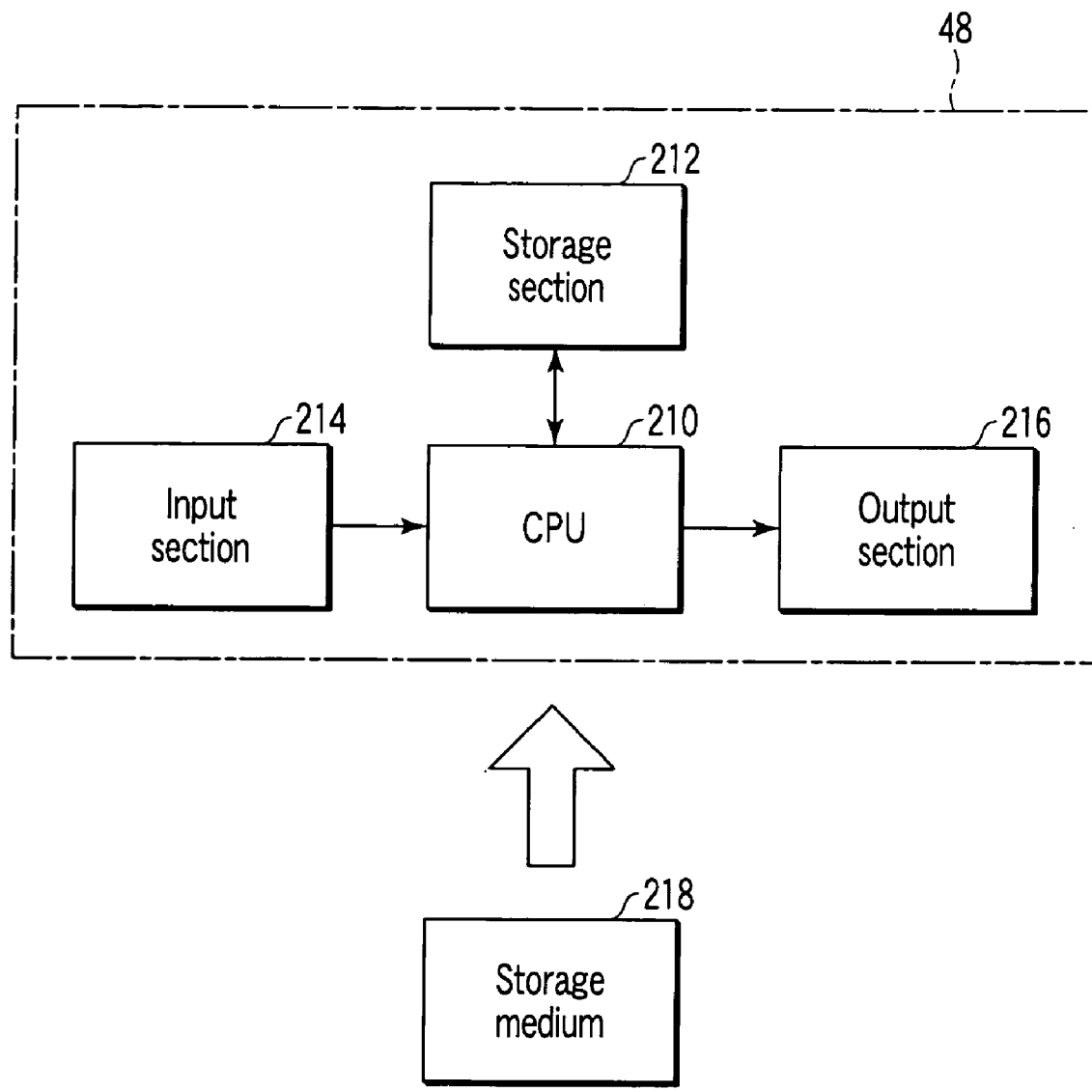
FIG. 12 is a block diagram schematically showing the structure of a main control section.

Each of the methods according to the first and second embodiment is performed under the control of the main control section 48 in accordance with a process program, as described above. FIG. 12 is a block diagram schematically showing the structure of the main control section 48. The main control section 48 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 12 also shows a storage medium 218 attached to the computer in a removable state.

Each of the methods according to the first and second embodiment may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard-disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described above.

In the first and second embodiments, for example, the source gas contains DCS gas as a silane family gas. In this respect, the silane family gas may be one or more gases selected from the group consisting of dichlorosilane (DCS), hexachlorodisilane (HCD), monosilane (SiH$_4$), disilane (Si$_2$Cl$_6$), hexamethyldisilazane (HMDS), tetrachlorosilane (TCS), disilylamine (DSA), trisilylamine (TSA), bistertialbutylaminosilane (BTBAS).

In the first and second embodiments, the assist gas contains a nitriding gas, which may be NH$_3$ gas or N$_2$ gas. Where the present invention is applied to formation of a silicon oxynitride film, an oxynitriding gas, such as dinitrogen oxide (N$_2$O) or nitrogen oxide (NO), may be used in place of the nitriding gas. In this case, a film to be formed is not a silicon nitride film doped with an impurity, but a silicon oxynitride film doped with an impurity.

In the first and second embodiments, for example, the supplementary gas contains BCl$_3$ gas as a doping gas. In this respect, the doping gas may be one or more gases selected from the group consisting of BCl$_3$, B$_2$H$_6$, BF$_3$, and B(CH$_3$)$_3$.

In the first and second embodiments, the exciting section 50 for generating plasma of the film formation apparatus 2 is integrally combined with the process container 4. Alternatively, the exciting section 50 may be separately disposed from the process container 4, so as to excite NH$_3$ gas outside the process container 4 (so called remote plasma), and then supply the excited NH$_3$ gas into the process container 4. A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process for forming a silicon nitride film of silicon nitride or silicon oxynitride doped with an impurity on a target substrate by CVD, by repeating a cycle a plurality of times to laminate thin films formed by respective times, thereby arriving at a film having a target thickness, in a process field, which is configured to be selectively supplied with a first process gas containing a silane family gas, a second process gas containing a nitriding gas, and a third process gas containing a doping gas, and communicates with an exciting mechanism configured to selectively excite the second process gas to be supplied to the process field, the cycle comprising:

a first step of performing supply of the first, second, and third process gases to the process field, while not exciting the second process gas by the exciting mechanism;

a second step of shutting off supply of the first, second, and third process gases to the process field;

a third step of performing supply of the second process gas to the process field while shutting off supply of the first and third process gases to the process field, the third step comprising an excitation period of supplying the second process gas to the process field while exciting the second process gas by the exciting mechanism; and a fourth step of shutting off supply of the first, second, and third process gases to the process field.

2. The method according to claim 1, wherein the third step further comprises a period of supplying the second process gas to the process field while not exciting the second process gas by the exciting mechanism, before the excitation period.

3. The method according to claim 1, wherein each of the second and fourth steps comprises a period of supplying a purge gas to the process field.

4. The method according to claim 1, wherein gas inside the process field is kept exhausted from the first step to the fourth step.

5. The method according to claim 1, wherein the exciting mechanism comprises a plasma generation area disposed in a space communicating with the process field and between a supply port of the second process gas and the target substrate, and the second process gas is excited while passing through the plasma generation area.

6. The method according to claim 5, wherein the first and third process gases are supplied to the process field from a position between the plasma generation area and the target substrate.

7. The method according to claim 5, wherein the process field is configured to accommodate a plurality of target substrates at intervals in a vertical direction, and the target substrates are heated by a heater disposed around the process field.

8. The method according to claim 7, wherein each of the first, second, and third process gases is supplied from a plurality of gas spouting holes to form gas flows parallel with the target substrates, and the gas spouting holes are arrayed over the target substrates in a vertical direction.

9. The method according to claim 1, wherein in order to control stress to be generated in the film, the method further comprising a preparatory step of using a flow rate of the doping gas in the first step as a parameter.

10. The method according to claim 9, wherein the preparatory step is arranged to preset a flow rate used for the doping gas in the first step, so as to generate stress of a desired level and a desired type in the nitride film.

11. The method according to claim 9, wherein the nitride film is a film for covering a PMOS transistor, and the preparatory step is arranged to preset a flow rate used for the doping gas in the first step to be larger than a predetermined value and to preset a process temperature used for the cycle to be higher than a predetermined value, so as to generate a compressive stress in the nitride film.

12. The method according to claim 1, wherein the silane family gas comprises at least one gas selected from the group consisting of dichlorosilane, hexachlorodisilane, monosilane, disilane, hexamethyldisilazane, tetrachlorosilane, disilylamine, trisilylamine, and bistertialbutylaminosilane, and the second process gas contains at least one gas selected from the group consisting of ammonia, nitrogen, dinitrogen oxide, and nitriding gas comprises ammonia.

13. The method according to claim 12, wherein the doping gas contains at least one gas selected from the group consisting of BCl$_3$, B$_2$H$_6$, BF$_3$, and B(CH$_3$)$_3$.

14. The method according to claim 12, wherein the first step is arranged to supply the nitriding gas at a flow rate smaller than that of the silane family gas.

15. The method according to claim 14, wherein the first step is arranged to supply the nitriding gas at a flow rate smaller than that of the nitriding gas in the third step.

* * * * *